(12) United States Patent
Do

(10) Patent No.: US 7,999,592 B2
(45) Date of Patent: *Aug. 16, 2011

(54) DELAY CIRCUIT OF SEMICONDUCTOR DEVICE

(75) Inventor: Chang-Ho Do, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/875,019

(22) Filed: Sep. 2, 2010

(65) Prior Publication Data

US 2010/0327935 A1    Dec. 30, 2010

Related U.S. Application Data

(62) Division of application No. 11/982,019, filed on Nov. 1, 2007.

(30) Foreign Application Priority Data

Nov. 2, 2006  (KR) .................. 10-2006-0107888
Aug. 30, 2007  (KR) .................. 10-2007-0087594

(51) Int. Cl.
*H03H 11/26* (2006.01)
(52) U.S. Cl. .................. 327/270; 327/284; 327/272
(58) Field of Classification Search .................. 327/270, 327/272, 284, 285, 288
See application file for complete search history.

(56) References Cited

U.S. PATENT DOCUMENTS

| | | | |
|---|---|---|---|
| 5,796,284 A * | 8/1998 | Clemen et al. ........... | 327/264 |
| 6,297,624 B1 * | 10/2001 | Mitsui et al. ........... | 323/316 |
| 6,603,340 B2 * | 8/2003 | Tachimori ........... | 327/262 |
| 6,744,303 B1 * | 6/2004 | Maley ........... | 327/538 |
| 6,842,078 B2 * | 1/2005 | Manna et al. ........... | 331/57 |
| 6,958,641 B2 * | 10/2005 | Lee ........... | 327/261 |
| 6,996,018 B2 * | 2/2006 | Yun ........... | 365/205 |
| 7,212,067 B2 * | 5/2007 | Pasternak ........... | 327/541 |
| 7,301,830 B2 * | 11/2007 | Takahashi et al. ........... | 365/194 |
| 7,425,857 B2 * | 9/2008 | Confalonieri et al. ........... | 327/264 |
| 7,501,884 B2 * | 3/2009 | Chen ........... | 327/543 |
| 7,570,039 B1 * | 8/2009 | Vu ........... | 323/299 |
| 7,599,141 B2 * | 10/2009 | Okamura ........... | 360/69 |
| 7,638,821 B2 * | 12/2009 | Aoki ........... | 257/204 |
| 2005/0001667 A1 * | 1/2005 | Lee ........... | 327/261 |
| 2006/0104386 A1 * | 5/2006 | Leon ........... | 375/332 |
| 2008/0007272 A1 * | 1/2008 | Ferraiolo et al. ........... | 324/617 |
| 2008/0129325 A1 * | 6/2008 | Ferraiolo et al. ........... | 324/765 |
| 2008/0150623 A1 * | 6/2008 | Lin et al. ........... | 327/541 |
| 2009/0014801 A1 * | 1/2009 | Chen et al. ........... | 257/357 |
| 2009/0039950 A1 * | 2/2009 | Takeuchi ........... | 327/541 |
| 2010/0078696 A1 * | 4/2010 | Kim ........... | 257/296 |

FOREIGN PATENT DOCUMENTS

KR    1020010059450    7/2001

* cited by examiner

*Primary Examiner* — Lincoln Donovan
*Assistant Examiner* — Adam D Houston
(74) *Attorney, Agent, or Firm* — Blakely, Sokoloff, Taylor & Zafman

(57) ABSTRACT

A delay circuit of a semiconductor device increases its delay time as an external voltage increases. The delay circuit can also ensure a desired delay time according to an external voltage, without additional delay circuits. The delay circuit of the semiconductor device includes a first delay unit, and a second delay. The second delay unit has a propagation delay characteristic different from that of the first delay unit with respect to variation of a power supply voltage, wherein the first delay unit is supplied with a first power supply voltage independent of variation of an external voltage, and the second delay unit is supplied with a second power supply voltage dependent on the variation of the external voltage.

8 Claims, 3 Drawing Sheets

DELAY CIRCUIT OF SEMICONDUCTOR DEVICE

The present patent application is a Divisional application claiming the benefit of application Ser. No. 11/982,019, filed Nov. 1, 2007.

CROSS-REFERENCE TO RELATED APPLICATIONS

The present invention claims priority to Korean patent applications numbers 10-2006-0107888 and 10-2007-0087594, filed on Nov. 2, 2006 and Aug. 30, 2007 respectively, which are incorporated by reference in its entirety.

BACKGROUND OF THE INVENTION

The present invention relates to a semiconductor device, and more particularly, to a delay circuit of a semiconductor device.

Generally, a semiconductor device, e.g., a double data rate synchronous dynamic random access memory (DDR SDRAM), includes a plurality of delay circuits for various purposes. The delay circuit is configured to delay an input signal by a predetermined time. The delay circuit may be implemented using logic gates, resistors, capacitors, and so on.

FIG. 1 illustrates a schematic circuit diagram of a conventional delay circuit. Referring to FIG. 1, the conventional delay circuit includes an inverter INV configured to receive an input signal IN, a resistor R connected between a node A, i.e., an output node of the inverter INV, and an output node B, and a capacitor C connected between the output node B and a ground terminal VSS.

The inverter INV includes a PMOS transistor PM and an NMOS transistor NM. The PMOS transistor PM has a source connected to an external voltage terminal VDD_EXT, a drain connected to the node A, and a gate receiving the input signal IN. The NMOS transistor NM has a drain connected to the node A, a source connected to the ground terminal VSS, and a gate receiving the Input signal IN.

A delay time of the delay circuit is determined by resistance and capacitance of a path through which the input signal IN is transferred. The resistance of the path means a sum of an on resistance of the inverter INV driving the node A, a parasitic resistance generated due to a line on the path, and a resistance of the resistor R. The capacitance of the path means a sum of a capacitance of the line itself, a parasitic capacitance on the gates of the transistors PM and NM receiving the input signal IN, and a capacitance of the capacitor C for the intended delay.

Eq. 1 below shows the relationship between the delay time, the resistance and the capacitance.

$$Td \propto (R_{on}+R_L) \times C_L \qquad \text{Eq. 1}$$

where Td is the delay time, $R_{on}$ is the on resistance of the inverter INV, $R_L$ is a sum of the parasitic resistance of the line and the resistance of the resistor R, and $C_L$ is a sum of the capacitance of the line itself, the parasitic capacitance on the gates of the transistors, and the capacitance of the capacitor C.

As can be seen from Eq. 1, the delay time of the delay circuit increases when the resistance or capacitance increases, but decreases when the resistance or capacitance decreases.

An external voltage of the external voltage terminal VDD_EXT is applied to the inverter INV. As the external voltage increases, the on resistance of the inverter INV decreases and thus the delay time decreases. That is, the inverter INV has a propagation delay characteristic that the delay time decreases as the external voltage increases. If the voltage applied to the Inverter INV is not the external voltage but an internal voltage having a predetermined voltage level, the inverter INV has a propagation delay characteristic that it has a constant delay time regardless of the external voltage. Further, since the ground terminal VSS is connected to the capacitor C, the delay circuit has a propagation delay characteristic that it has a constant delay time regardless of the external voltage.

In a data read/write operation, the DDR SDRAM must ensure a sensing margin time, that is, a time until an amplification operation of a bit line sense amplifier is started after a word line is activated. To ensure the sensing margin time, the delay circuit is required to have a propagation delay characteristic that the delay time increases as the external voltage increases. Therefore, an additional delay circuit must be designed according to the external voltage. Further, the sensing margin time cannot be ensured when the delay time decreases as the external voltage increases. In this case, polarity of data may be changed.

SUMMARY OF THE INVENTION

Embodiments of the present invention are directed to providing a delay circuit of a semiconductor device, in which its delay time increases as an external voltage increases.

Embodiments of the present invention are also directed to providing a delay circuit of a semiconductor device, which can ensure a desired delay time according to an external voltage, without additional delay circuits.

In one embodiment, a delay circuit of a semiconductor device includes a first delay unit, and a second delay unit having a propagation delay characteristic different from that of the first delay unit with respect to variation of a power supply voltage, wherein the first delay unit is supplied with a first power supply voltage independent of variation of an external voltage, and the second delay unit is supplied with a second power supply voltage dependent on the variation of the external voltage.

In another embodiment, a delay circuit of a semiconductor device includes a plurality of inverters configured to receive first and second voltages independent of variation of an external voltage, and a plurality of delay units configured to receive a third voltage dependent on the variation of the external voltage.

DESCRIPTION OF SPECIFIC EMBODIMENTS

In a delay circuit of the present invention using a plurality of delay units, different voltages are applied to a first delay unit and a second delay unit. Thus, the first delay unit has a characteristic that a delay time is independent of an external voltage, and the second delay unit has a characteristic that the delay time increase as the external voltage increases. Consequently, the delay circuit has a propagation delay characteristic in which the delay time increases as the external voltage increases.

Hereinafter, a delay circuit of a semiconductor device in accordance with the present invention will be described in detail with reference to the accompanying drawings.

Figure 1:
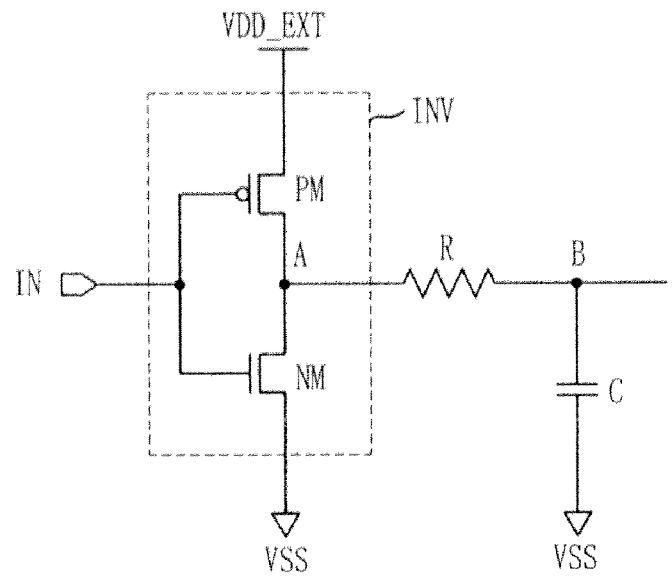
FIG. 1 illustrates a schematic circuit diagram of a conventional delay circuit.
Figure 2:
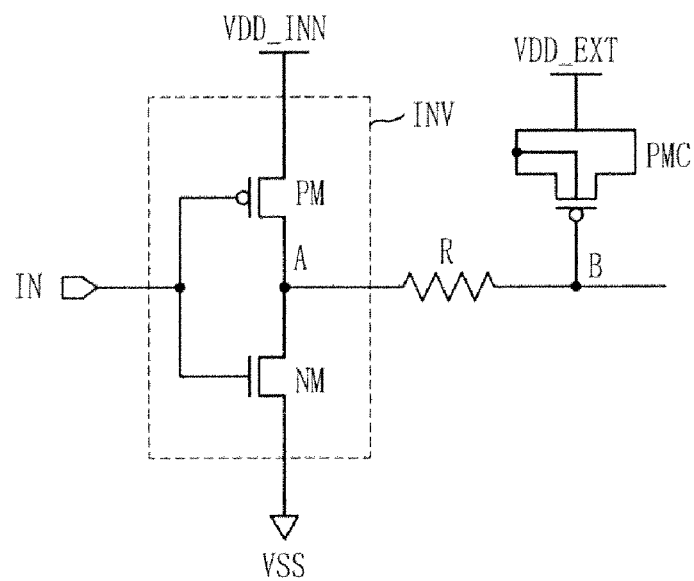
FIG. 2 illustrates a schematic circuit diagram of a delay circuit of a semiconductor device in accordance with a first embodiment of the present invention.

FIG. 2 illustrates a schematic circuit diagram of a delay circuit of a semiconductor device in accordance with a first embodiment of the present invention.

Referring to FIG. 2, the delay circuit includes an inverter INV, a resistor R, and a PMOS type capacitor PMC. The inverter INV is connected between an internal voltage terminal VDD_INN and a ground terminal VSS and configured to receive an input signal IN. The resistor R is connected between a node A, i.e., an output node of the inverter INV and an output node B. The PMOS type capacitor PMC is connected between an external voltage terminal VDD_EXT and the output node B.

The inverter INV includes a PMOS transistor PM and an NMOS transistor NM. The PMOS transistor PM has a source connected to the internal voltage terminal VDD_INN, a drain connected to the node A, and a gate receiving the input signal IN. The NMOS transistor NM has a drain connected to the node A, a source connected to the ground terminal VSS, and a gate receiving the input signal IN.

The PMOS type capacitor PMC is implemented with a PMOS transistor having a source and a drain commonly connected to the external voltage terminal VDD_EXT, and a gate connected to the output node B. A bulk terminal may also be connected to the external voltage terminal VDD_EXT, or may be separated according to circumstances.

Figure 3:
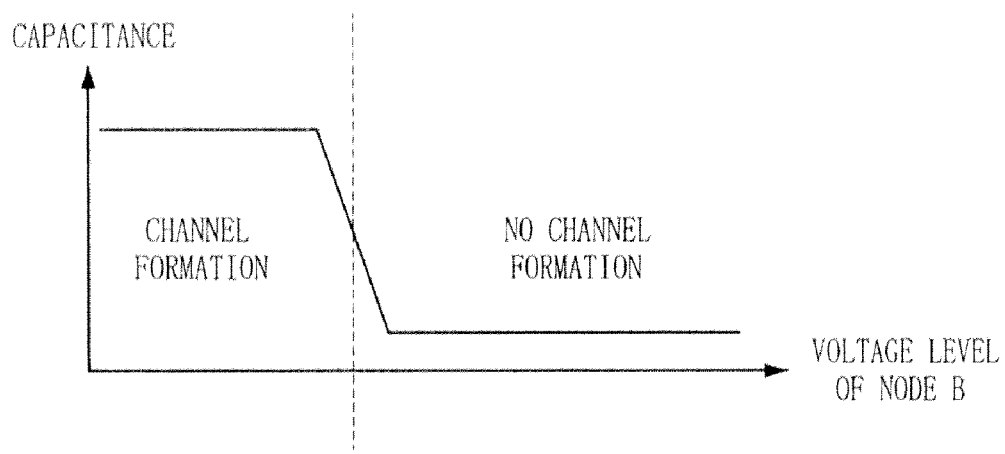
FIG. 3 illustrates a graph of a capacitance according to formation/non-formation of a channel in the PMOS type capacitor described in FIG. 2.

In the PMOS type capacitor PMC, the capacitance when a channel is formed between the source and the drain is different from the capacitance when no channel is formed between the source and the drain. The formation/non-formation of the channel in the PMOS type capacitor PMC is determined by a relative potential difference between the two terminals of the PMOS type capacitor PMC. FIG. 3 illustrates a graph of the capacitance of the PMOS type capacitor PMC according to the formation/non-formation of the channel in the PMOS type capacitor PMC. In FIG. 3, a horizontal axis represents a voltage level of the output node B, and a vertical axis represents a capacitance of the POMS type capacitor PMC.

Referring to FIGS. 2 and 3, the PMOS type capacitor PMC is connected between the external voltage terminal VDD_EXT and the output node B. Therefore, the channel may or may not be formed in the PMOS type capacitor PMC according to the voltage level of the output node B. As can be seen from FIG. 3, the capacitance when the channel is formed is greater than the capacitance when no channel is formed. In other words, the capacitance acting as the load when the channel is formed is greater than the capacitance when no channel is formed. The channel is formed in a condition of Eq. 2 below.

$$V_{gs} - V_t > 0 \qquad \text{Eq. 2}$$

where $V_{gs}$ is a voltage difference between the gate and the source of the PMOS type capacitor PMC, and $V_t$ is the threshold voltage of the PMOS type capacitor PMC.

The capacitance of the PMOS type capacitor PMC according to the external voltage applied through the external voltage terminal VDD_EXT will be described below with reference to FIG. 4.

Figure 4:
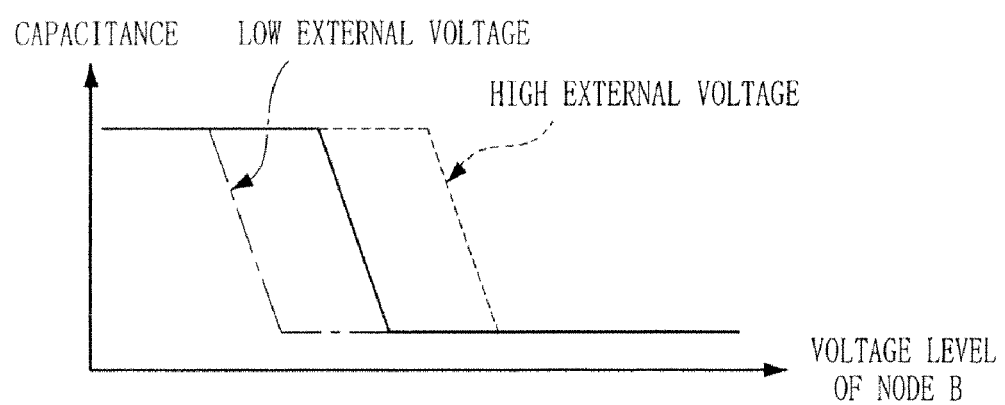
FIG. 4 illustrates a graph of a capacitance according to an external voltage applied to the PMOS type capacitor described in FIG. 2.

Referring to FIG. 4, the channel formation section changes according to the external voltage. As the external voltage increases, the channel formation section becomes long. This means that a large capacitance is maintained longer and it acts as a large-capacitance load for a longer time.

For example, if the large capacitance (when the channel is formed) occupies 20% of the delay time and the small capacitance (when no channel is formed) occupies 80% of the delay time when the external voltage is low, the large capacitance occupies 80% of the delay time and the small capacitance occupies 20% of the delay time when the external voltage is high. Consequently, the delay time increases linearly as the external voltage increases.

Figure 5:
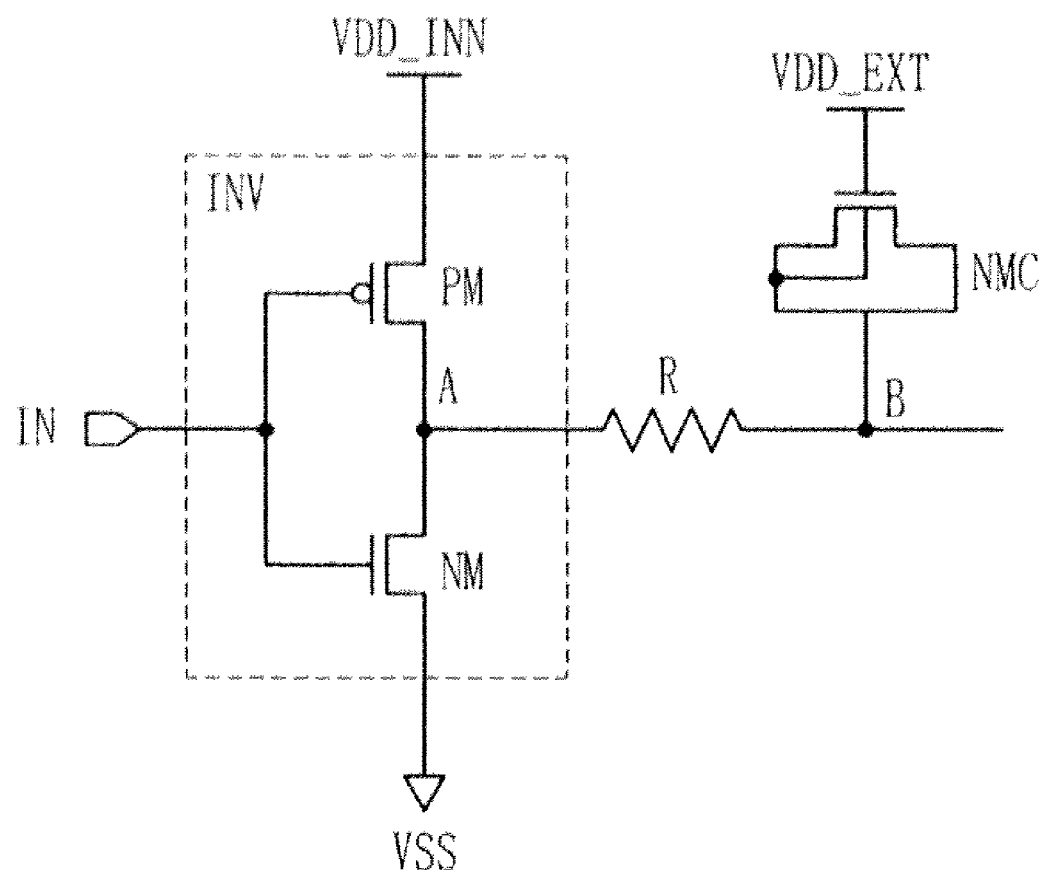
FIG. 5 illustrates a schematic circuit diagram of a delay circuit of a semiconductor device in accordance with a second embodiment of the present invention.

FIG. 5 illustrates a schematic circuit diagram of a delay circuit of a semiconductor device in accordance with a second embodiment of the present invention. For convenience, like reference numerals are used to refer to like elements throughout the drawings.

Referring to FIG. 5, the delay circuit in accordance with the second embodiment of the present invention includes an inverter, a resistor R, and an NMOS type capacitor NMC. The NMOS type capacitor NMC can achieve the same operation as the PMOS type capacitor PMC described in FIG. 2.

The NMOS type capacitor NMC is implemented with an NMOS transistor having a gate receiving an external voltage terminal VDD_EXT, and a drain and a source commonly connected to an output node B. Likewise, a bulk terminal may be connected to the output node B, or may be separated according to circumstances.

Like the PMOS type capacitor PMC, a capacitance of the NMOS type capacitor NMC when a channel is formed between the drain and the source is different from a capacitance of the NMOS type capacitor NMC when no channel is formed between the drain and the source. The formation/non-formation of the channel in the NMOS type capacitor NMC is determined by a relative potential difference between the two terminals of the NMOS type capacitor NMC. The capacitance according to the formation/non-formation of a channel in the NMOS type capacitor NMC is equal to that illustrated in FIG. 3, and the channel formation section according to the external voltage is equal to that illustrated in FIG. 4.

As the external voltage increases, the channel formation section becomes longer. That is, the large capacitance section becomes longer, thus increasing the delay time.

Referring to FIGS. 2 and 5, the internal voltage applied through the internal voltage terminal VDD_INN to the inverter INV is an independently fixed voltage with respect to the variation of the external voltage and has a constant voltage level so as to drive the inverter INV. Therefore, the inverter INV has a propagation delay characteristic in which the delay time is constant, regardless of the external voltage. Further, the PMOS type capacitor PMC and the NMOS type capacitor NMC have a propagation delay characteristic in which the delay time increases as the external voltage increases.

The voltages applied to the PMOS type capacitor PMC and the NMOS type capacitor NMC are not necessarily equal to the external voltage. In other words, any voltages can be applied to the PMOS type capacitor PMC and the NMOS type capacitor NMC only if they are dependent on the external voltage.

The semiconductor memory device may include a plurality of delay circuits illustrated in FIG. 2.

As described above, the delay circuit of the semiconductor device can obtain the propagation delay characteristic in which the delay time increases as the external voltage increases. In the circuits using a high voltage source, this propagation delay characteristic is significantly advantageous to increase the delay time without additional circuits. Particularly, the delay circuits in accordance with the embodiments of the present invention are adapted to ensure the sensing margin time.

In accordance with the embodiments of the present invention, the delay circuit can obtain the propagation delay characteristic in which the delay time increases according to the variation of the external voltage. By applying the delay circuit to circuits requiring the propagation delay characteristic, the more stable circuit operation can be obtained. Further, problems caused by insufficient sensing margin time can be prevented.

While the present invention has been described with respect to the specific embodiments, it will be apparent to those skilled in the art that various changes and modifications may be made without departing from the spirit and scope of the invention as defined in the following claims.

What is claimed is:

1. A delay circuit of a semiconductor device, comprising:
    a first delay unit configured to be supplied with a first power supply voltage independent of variation of an external voltage; and
    a second delay unit having a propagation delay characteristic different from that of the first delay unit with respect to variation of a second power supply voltage,
    wherein the second delay unit includes an NMOS transistor having a gate receiving the second power supply voltage, and a source and a drain connected to an output node of the first delay unit and the second power supply voltage is dependent upon the variation of an external voltage.

2. The delay circuit as recited in claim 1, further comprising a third delay unit connected between the first delay unit and the second delay unit.

3. The delay circuit as recited in claim 1, wherein the first delay unit has a fixed delay time.

4. The delay circuit as recited in claim 1, wherein the second delay unit has a delay time corresponding to the second power supply voltage.

5. The delay circuit as recited in claim 1, wherein the second delay unit propagation delay characteristic includes a delay time which increases as the second power supply voltage increases.

6. The delay circuit as recited in claim 5, wherein a bulk terminal of the NMOS transistor is connected to the output node of the first delay unit.

7. The delay circuit as recited in claim 1, wherein the second power supply voltage has a voltage level substantially equal to the external voltage.

8. The delay circuit as recited in claim 1, wherein the first power supply voltage is supplied to the first delay unit constantly.

* * * * *